(12) United States Patent
Mao et al.

(10) Patent No.: US 11,837,673 B1
(45) Date of Patent: Dec. 5, 2023

(54) PHOTOVOLTAIC CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jie Mao, Zhejiang (CN); Zhao Wang, Zhejiang (CN); Peiting Zheng, Zhejiang (CN); Jie Yang, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/960,711

(22) Filed: Oct. 5, 2022

(30) Foreign Application Priority Data

Sep. 8, 2022 (CN) .......................... 202211098150.1

(51) Int. Cl.
*H01L 31/0236* (2006.01)
*H01L 31/048* (2014.01)

(52) U.S. Cl.
CPC ...... *H01L 31/02363* (2013.01); *H01L 31/048* (2013.01)

(58) Field of Classification Search
CPC ......... H01L 31/022441; H01L 31/0236; H01L 31/02363; H01L 31/04; H01L 31/042; H01L 31/048; H01L 31/0481; H01L 31/0488; H01L 31/049; H01L 33/22
See application file for complete search history.

(56) References Cited

U.S. PATENT DOCUMENTS

| 11,581,454 B1 | 2/2023 | Yu et al. |
| 2010/0065117 A1 | 3/2010 | Kim et al. |
| 2012/0090673 A1 | 4/2012 | Dimitrov et al. |

(Continued)

FOREIGN PATENT DOCUMENTS

| AU | 2021225144 B1 | 6/2022 |
| CN | 104409571 A * | 3/2015 |

(Continued)

OTHER PUBLICATIONS

Machine translation of CN-104409571-A, Guo W. (Year: 2015).*

(Continued)

*Primary Examiner* — Mayla Gonzalez Ramos
(74) *Attorney, Agent, or Firm* — USCH Law, PC (57) ABSTRACT

A photovoltaic cell is provided, including a substrate having a front surface with metal and non-metal pattern regions, first and second pyramid structures in each metal pattern region, third and fourth pyramid structures in each non-metal pattern region, a first tunneling layer and a first doped conductive layer on a portion of the front surface in a respective metal pattern region, and a second tunneling layer and a second doped conductive layer on a rear surface of the substrate. A dimension of a bottom portion of each first pyramid structure is greater than that of each second pyramid structure. A dimension of a bottom portion of each third pyramid structure is greater than that of each fourth pyramid structure. An area proportion of the first pyramid structures in the metal pattern region is greater than that of the third pyramid structures in a respective non-metal pattern region.

20 Claims, 3 Drawing Sheets

(56) References Cited

U.S. PATENT DOCUMENTS

| | | | |
|---|---|---|---|
| 2019/0157497 A1 | | 5/2019 | Yoon et al. |
| 2020/0135944 A1 * | | 4/2020 | Yi .................. H01L 31/068 |
| 2020/0350445 A1 | | 11/2020 | Cheong et al. |
| 2021/0399150 A1 | | 12/2021 | Hilali et al. |
| 2022/0209031 A1 | | 6/2022 | Breus et al. |

FOREIGN PATENT DOCUMENTS

| | | | |
|---|---|---|---|
| CN | 205194713 U | | 4/2016 |
| CN | 110610998 A | * | 12/2019 |
| CN | 111146311 A | | 5/2020 |
| CN | 112885924 A | | 6/2021 |
| CN | 113078232 A | | 7/2021 |
| CN | 113964241 A | | 1/2022 |
| CN | 114613865 A | | 6/2022 |
| CN | 114613867 A | | 6/2022 |
| CN | 114823951 A | | 7/2022 |
| CN | 216871997 U | | 7/2022 |
| CN | 217306521 U | | 8/2022 |
| DE | 102021000501 A1 | | 8/2022 |
| EP | 2704214 B1 | | 10/2018 |
| EP | 3979336 A1 | | 4/2022 |
| JP | 2012129533 A | | 7/2012 |
| JP | 2012164712 A | | 8/2012 |
| JP | 2014082285 A | | 5/2014 |
| JP | 2014192370 A | | 10/2014 |
| JP | 2014238969 A | | 12/2014 |
| JP | 2015531550 A | | 11/2015 |
| JP | 2017112379 A | | 6/2017 |
| JP | 2017126748 A | | 7/2017 |
| JP | 2017130664 A | | 7/2017 |
| JP | 2018082157 A | | 5/2018 |
| JP | 2018085509 A | | 5/2018 |
| JP | 2019068108 A | | 4/2019 |
| JP | 2022058069 A | | 4/2022 |
| JP | 2022081366 A | | 5/2022 |
| KR | 20140003669 A | | 1/2014 |
| KR | 20210067386 A | | 6/2021 |
| WO | WO-2013161373 A1 | * | 10/2013 ....... H01L 31/02168 |
| WO | 2014162979 A1 | | 10/2014 |
| WO | 2017002927 A1 | | 1/2017 |

OTHER PUBLICATIONS

Machine translation of CN-110610998-A, Kuangy. (Year: 2019).*
Zhejiang Jinko Solar Co., Ltd., et al., Extended European Search Report, EP 22199678.8, dated Aug. 16, 2023, 6 pgs.
Zhejiang Jinko Solar Co., Ltd., et al., Notice-of-Allowance, U.S. Appl. No. 17/960,687, dated Jun. 1, 2023, 9 pgs.
Zhejiang Jinko Solar Co., Ltd., et al., Extended European Search Report, EP 22199634.1, dated Jul. 5, 2023, 7 pgs.
Zhejiang Jinko Solar Co., Ltd., et al., Extended European Search Report, EP 22204989.2, dated Aug. 24, 2023, 7 pgs.
Peibst Robby, et al., "For None, One, or Two Polarities—How Do Polo Junctions Fit Best Into Industrial Si Solar Cells?", Progress in Photovoltaics: Research and Applications, vol. 28, No. 6, Hoboken, USA, ISSN:1062-7995, DOI:10.1002/PIP.3201, Jun. 1, 2020, 14 pgs.
Haase F, et al., "Cells and Modules With Passivating Contacts-Polo Technology", May 9, 2019, 13 pgs. Retrieved From the Internet: URL:https://16iwy1195vvfgoqu3136p21y-wpengine.netdna-ssl.com/wp-content/uploads/2019/04/20190509_Webinar-PERC-and-beyond_Haase.pdf.
Charles Seron, et al., "Hydrogenation of Sputtered ZnO: Al Layers for Double Side Poly-Si/Siox Integration", 38th European Photovoltaic Solar Energy Conference and Exhibition, Sep. 10, 2021, 4 pgs.
E. Saugar, et al., "Laser-Induced Crystallization of Sputtered Unhydrogenated Silicon At Low Temperatures", 33rd European Photovoltaic Solar Energy Conference and Exhibition: Proceedings of the International Conference, Sep. 2017, 5 pgs.
Zhejiang Jinko Solar Co., Ltd. et al., AU2022246372 Notice of Acceptance for your patent application, AU2022246372, dated Sep. 11, 2023, 4pgs.
Zhejiang Jinko Solar Co., Ltd. et al., AU2022246370 Notice of Acceptance for your patent application, AU2022246370, dated Aug. 29, 2023, 4pgs.

* cited by examiner

PHOTOVOLTAIC CELL AND PHOTOVOLTAIC MODULE

CROSS-REFERENCE TO RELATED APPLICATION

The present application claims the benefit of priority under the Paris Convention to Chinese Patent Application No. 202211098150.1 filed on Sep. 8, 2022, which is incorporated herein by reference in its entirety.

TECHNICAL FIELD

Embodiments of the present disclosure relate in general to photovoltaic cell technology, and more particularly to a photovoltaic cell and a photovoltaic module.

BACKGROUND

Photovoltaic cells have good photoelectric conversion capabilities. Generally, texture treatment needs to be performed first in the process of preparing a photovoltaic cell, so that a front surface and a rear surface of a substrate have a texture structure. The texture structure has an important influence on absorption of incident light of the substrate, uniformity of film layers subsequently deposited on the substrate and contact performance with an interface of the substrate, thereby further affecting photoelectric conversion performance of the photovoltaic cell.

However, conventional photovoltaic cells have low photoelectric conversion efficiency.

SUMMARY

Some embodiments of the present disclosure provide a photovoltaic cell and a photovoltaic module, which are at least conducive to improving photoelectric conversion efficiency of the photovoltaic cell.

Some embodiments of the present disclosure provide a photovoltaic cell including: a substrate, wherein the substrate has a front surface with a plurality of metal pattern regions and a plurality of non-metal pattern regions; a plurality of first pyramid structures and a plurality of second pyramid structures disposed in each of the plurality of metal pattern regions, wherein a dimension of a bottom portion of each of the plurality of first pyramid structures is greater than a dimension of a bottom portion of each of the plurality of second pyramid structures; a plurality of third pyramid structures and a plurality of fourth pyramid structures disposed in each of the plurality of non-metal pattern regions, wherein a dimension of a bottom portion of each of the plurality of third pyramid structures is greater than a dimension of a bottom portion of each of the plurality of fourth pyramid structures; and wherein an area proportion of the plurality of first pyramid structures on a portion of the front surface of the substrate in a respective metal pattern region is greater than an area proportion of the plurality of third pyramid structures on a portion of the front surface of the substrate in a respective non-metal pattern region; a first tunneling layer and a first doped conductive layer stacked on the portion of the front surface of the substrate in the respective metal pattern region in a direction away from the substrate; and a second tunneling layer and a second doped conductive layer stacked on a rear surface of the substrate in a direction away from the substrate.

In some embodiments, the area proportion of the plurality of first pyramid structures on the portion of the front surface of the substrate in the respective metal pattern region is greater than an area proportion of the plurality of second pyramid structures on the portion of the front surface of the substrate in the respective metal pattern region.

In some embodiments, the area proportion of the plurality of first pyramid structures on the portion of the front surface of the substrate in the respective metal pattern region is in a range of 80% to 90%, and the area proportion of the plurality of second pyramid structures on the portion of the front surface of the substrate in the respective metal pattern region is in a range of 10% to 20%.

In some embodiments, a one-dimensional dimension of the bottom portion of each of the plurality of first pyramid structures is in a range of 0.7 μm to 3 μm, and a one-dimensional dimension of the bottom portion of each of the plurality of second pyramid structures is less than 1 μm.

In some embodiments, a thickness of the first tunneling layer is in a range of 0.5 nm to 5 nm, and a thickness of the first doped conductive layer is in a range of 20 nm to 300 nm.

In some embodiments, the first doped conductive layer includes first doping elements, the first doping elements have been annealed and activated to obtain activated first doping elements, and an activation rate of the first doping elements in the first doped conductive layer is in a range of 40% to 80%.

In some embodiments, a concentration of the activated first doping elements is in a range of $10^{20}$ atom/cm$^3$ to $6\times10^{20}$ atom/cm$^3$.

In some embodiments, a height from top to bottom of each of the plurality of first pyramid structures is not less than a height of from top to bottom of each of the plurality of second pyramid structures.

In some embodiments, the area proportion of the plurality of third pyramid structures on the portion of the front surface of the substrate in the respective non-metal pattern region is greater than an area proportion of the plurality of fourth pyramid structures on the portion of the front surface of the substrate in the respective non-metal pattern region.

In some embodiments, the area proportion of the plurality of third pyramid structures on the portion of the front surface of the substrate in the respective non-metal pattern region is in a range of 50% to 70%, and the area proportion of the plurality of fourth pyramid structures on the portion of the front surface of the substrate in the respective non-metal pattern region is in a range of 30% to 50%.

In some embodiments, a one-dimensional dimension of the bottom portion of each of the plurality of third pyramid structures is in a range of 0.7 μm to 3 μm, and a one-dimensional dimension of the bottom portion of each of the plurality of fourth pyramid structures is less than 1 μm.

In some embodiments, a reflectivity of the portion of the front surface of the substrate in the respective non-metal pattern region is in a range of 0.8% to 2%.

In some embodiments, the photovoltaic cell further includes a first passivation layer, wherein a first portion of the first passivation layer is disposed on a surface of the first doped conductive layer away from the substrate, and a second portion of the first passivation layer is disposed on the portion of the front surface of the substrate in the respective non-metal pattern region.

In some embodiments, the first portion of the first passivation layer is not flush with the second portion of the first passivation layer.

In some embodiments, the photovoltaic cell further includes a first electrode disposed in the respective metal pattern region and electrically connected to the first doped conductive layer.

In some embodiments, the photovoltaic cell further includes a diffusion region disposed inside a portion of the substrate in the respective metal pattern region, wherein a top portion of the diffusion region is in contact with the first tunneling layer, and a doping element concentration of the diffusion region is greater than a doping element concentration of the substrate.

In some embodiments, a doping element type of the first doped conductive layer is the same as a doping element type of the substrate, and a doping element type of the second doped conductive layer is different from the doping element type of the first doped conductive layer.

In some embodiments, the substrate includes an N-type substrate.

In some embodiments, a material of the first doped conductive layer includes at least one of silicon carbide, amorphous silicon, microcrystalline silicon and polycrystalline silicon, and the second doped conductive layer includes at least one of silicon carbide, amorphous silicon, microcrystalline silicon and polycrystalline silicon.

Some embodiments of the present disclosure provide a photovoltaic module including: at least one cell string, each of the at least one cell string formed by a plurality of photovoltaic cells according to the above embodiments which are electrically connected; at least one encapsulation layer, each of the at least one encapsulation layer configured to cover a surface of a respective cell string; and at least one cover plate, each of the at least one cover plate configured to cover a surface of a respective encapsulation layer facing away from the respective cell string.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION OF THE EMBODIMENTS

It is seen from BACKGROUND that, generally, conventional photovoltaic cells have low photoelectric conversion efficiency.

It is found that reasons for the low photoelectric conversion efficiency of the conventional photovoltaic cells are at least the following. First, a diffusion process is usually used to convert a portion of a substrate to an emitter on a front surface of the substrate, and doping elements in the emitter are of different types from those in the substrate such that the emitter forms a PN junction with the substrate. However, this kind of structure causes carrier recombination of a portion of the front surface of the substrate in a metal pattern region to be too large, thereby affecting an open-circuit voltage and conversion efficiency of the photoelectric cell. Secondly, for a texture surface of the substrate, a morphology of each texture structure of the texture surface is usually concerned, but dimension arrangement of overall texture structures is less concerned. In fact, the dimension arrangement of the overall texture structures has a great influence on the uniformity of film deposition on the surface of the substrate and the quality of bonding between the film layers and the texture surface. For example, when the quality of bonding between the film layers and the texture surface is poor, a contact surface between the film layers and the surface of the substrate may be uneven, thereby increasing the interface defects on the surface of the substrate, which further affects the mobility of the carriers and results in poor photoelectric conversion performance of the photovoltaic cell.

In the photovoltaic cell provided in the embodiments of the present disclosure, an area proportion of a plurality of first pyramid structures with larger dimensions in a respective metal pattern region is greater than an area proportion of a plurality of third pyramid structures with larger dimensions in a respective non-metal pattern region, so that uniformity of dimensions of pyramid structures in the metal pattern region is higher and roughness of the pyramid structures in the metal pattern region is greater, compared to those of pyramid structures in the non-metal pattern region. In this way, in an actual operation of depositing a first tunneling layer and a first doped conductive layer, deposition probabilities at different positions of the metal pattern region are similar to each other, so that uniformity of thicknesses of the deposited first tunneling layer and the deposited first doped conductive layer is improved, thereby reducing defects at an interface between the first tunneling layer and the front surface of the substrate, and improving mobility of carriers in the substrate to the first doped conductive layer.

In addition, the area proportion of the plurality of third pyramid structures with the larger dimensions in the non-metal pattern region is relatively small, i.e., the number of the third pyramid structures and the fourth pyramid structures per unit area in the non-metal pattern region is larger, and diffuse reflection effect on the incident light is generated between adjacent third pyramid structures or between a third pyramid structure and a fourth pyramid structure adjacent to each other, so that the reflectivity of the incident light is reduced. Moreover, the first doped conductive layer is not provided on a portion of the front surface of the substrate in the non-metal pattern region, so that absorption of the incident light in the non-metal pattern region is greatly increased. In the embodiments of the present disclosure, based on the structure in which the first tunneling layer and the first doped conductive layer are disposed only on the portion of the front surface of the substrate in the metal pattern region, dimension arrangement of the first pyramid structures and the second pyramid structures in the metal pattern region and dimension arrangement of the third pyramid structures and the fourth pyramid structures in the non-metal pattern region are designed to improve the mobility of the carriers while increasing the utilization of the incident light by the substrate, so that transmission efficiency of the carriers is improved while the absorption and utilization of the incident light by the front surface are improved.

Various embodiments of the present disclosure are described in detail below with reference to the accompanying drawings. Those of ordinary skill in the art should appreciate that many technical details have been proposed in various embodiments of the present disclosure for the better understanding of the present disclosure. However, the technical solutions claimed in the present disclosure are able to be realized even without these technical details and various changes and modifications based on the following embodiments.

Figure 1:
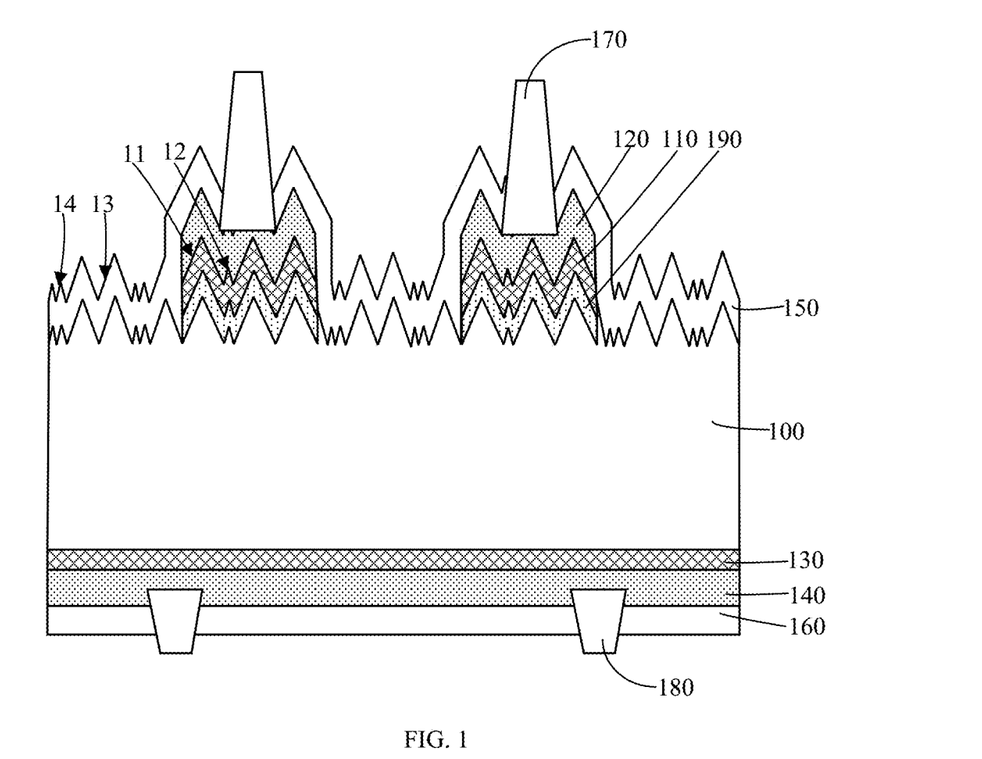
FIG. 1 is a schematic cross-sectional view of a photovoltaic cell according to an embodiment of the present disclosure.

FIG. 1 is a schematic cross-sectional view of a photovoltaic cell according to an embodiment of the present disclosure.

Referring to FIG. 1, the photovoltaic cell includes a substrate 100 having a front surface with a plurality of metal pattern regions and a plurality of non-metal pattern regions, a plurality of first pyramid structures 11 and a plurality of second pyramid structures 12 disposed in each of the plurality of metal pattern regions, a plurality of third pyramid structures 13 and a plurality of fourth pyramid structures 14 disposed in each of the plurality of non-metal pattern region, a first tunneling layer 110 and a first doped conductive layer 120 disposed on a portion of the front surface of the substrate 100 in a respective metal pattern region, and a second tunneling layer 130 and a second doped conductive layer 140 stacked on a rear surface of the substrate 100 in a direction away from the substrate 100. A dimension of a bottom portion of each of the plurality of first pyramid structures 11 is greater than a dimension of a bottom portion of each of the plurality of second pyramid structures 12. A dimension of a bottom portion of each of the plurality of third pyramid structures 13 is greater than a dimension of a bottom portion of each of the plurality of fourth pyramid structures 14. An area proportion of the plurality of first pyramid structures 11 on the portion of the front surface of the substrate in the respective metal pattern region (i.e., a proportion of an area occupied by the plurality of first pyramid structures 11 in the respective metal pattern region) is greater than an area proportion of the plurality of third pyramid structures 13 on the portion of the front surface of the substrate in the respective non-metal pattern region (i.e., a proportion of an area occupied by the plurality of third pyramid structures 13 in the respective non-metal pattern region).

In the embodiments of the present disclosure, dimension arrangement of the plurality of first pyramid structures 11 and the plurality of second pyramid structures 12 in the metal pattern region and dimension arrangement of the plurality of third pyramid structures 13 and the plurality of fourth pyramid structures 14 in the non-metal pattern region are designed based on the structure in which the first tunneling layer 110 and the first doped conductive layer 120 are disposed only on the portion of the front surface of the substrate 100 in the metal pattern region. An area proportion of the plurality of first pyramid structures 11 with larger dimensions in the metal pattern region is arranged to be large, so that uniformity of dimensions of the pyramid structures in the metal pattern region is higher and the roughness of the pyramid structures in the metal pattern region is larger. In this way, in actual operations of depositing the first tunneling layer 110 and the first doped conductive layer 120, deposition probabilities at different positions of the metal pattern region are close to each other, and uniformity of thicknesses of the deposited first tunneling layer 110 and the deposited first doped conductive layer 120 is improved, so that a contact interface between the first tunneling layer 110 and the substrate 100 is relatively flat, i.e., a probability of occurrence of voids at the contact interface between the first tunneling layer 110 and the substrate 100 is small, thereby reducing defects at an interface between the first tunneling layer 110 and the substrate 100, and improving mobility of carriers in the substrate 100 to the first doped conductive layer 120. In addition, since the portion of the front surface of the substrate 100 in the metal pattern region has large roughness, a contact area between the first tunneling layer 110 and the front surface of the substrate 100 is increased, thereby providing a larger tunneling channel for the carriers and further improving the mobility of the carriers.

The area proportion of the plurality of third pyramid structures 13 with the larger dimensions in the non-metal pattern region is arranged to be relatively small, so that the number of the third pyramid structures 13 and the fourth pyramid structures 14 per unit area is larger, thereby enhancing the diffuse reflection effect on the incident light, and reducing the reflectivity on the incident light. In addition, the first doped conductive layer 120 is not provided on the portion of the front surface of the substrate 100 in the non-metal pattern region, which avoids parasitic absorption of the incident light by the first doped conductive layer 120, thereby greatly increasing absorption of the incident light in the non-metal pattern region. In this way, the utilization of the incident light by the substrate 100 is increased while the mobility of the carriers is improved.

The substrate 100 is configured to receive the incident light and generate photogenerated carriers. In some embodiments, the substrate 100 may be a silicon substrate, and a material of the silicon substrate may include at least one of monocrystalline silicon, polysilicon, amorphous silicon, and microcrystalline silicon. In some embodiments, the material of the substrate 100 may also be silicon carbide, an organic material, or multicomponent compounds. The multicomponent compounds include, but are not limited to, materials such as perovskite, gallium arsenide, cadmium telluride, copper indium selenium, and the like.

In some embodiments, the substrate 100 has doping elements, and a type of the doping elements includes N-type or P-type. The N-type elements may be group V elements such as phosphorus (P), bismuth (Bi), antimony (Sb), arsenic (As), or the like. The P-type elements may be group III elements such as boron (B), aluminum (Al), gallium (Ga), indium (In), or the like. For example, when the substrate 100 is a P-type substrate, the type of the doping elements in the substrate 100 is P-type. In some embodiments, when the substrate 100 is an N-type substrate, the type of the doping elements in the substrate 100 is N-type.

Both the front and rear surfaces of the substrate 100 may be configured to receive incident or reflected light. The first tunnel layer 110 and the first doped conductive layer 120 on the front surface of the substrate 100 are configured to constitute a passivation contact structure on the front surface of the substrate 100, and the second tunnel layer 130 and the second doped conductive layer 140 on the rear surface of the substrate 100 are configured to constitute a passivation contact structure on the rear surface of the substrate 100. The passivation contact structures are respectively provided on the front surface and the rear surface of the substrate 100 so that the photovoltaic cell is formed as a double-sided tunnel oxide passivated contact (TOPCON) cell. In this way, the passivation contact structures formed on the front surface and the rear surface of the substrate 100 are capable of reducing carrier recombination on both the front surface and the rear surface of the substrate 100, which greatly reduces loss of the carriers of the photovoltaic cell as compared with forming the passivation contact structure on only one surface of the substrate 100, thereby increasing an open-circuit voltage and a short-circuit current of the photovoltaic cell. In the embodiments of the present disclosure, the first tunneling layer 110 and the first doped conductive layer 120 are disposed only on the portion of the front surface of the substrate 100 in the metal pattern region, so that the parasitic absorption of the incident light by the first doped conductive layer 120 is reduced, and the absorption and utilization of the incident light in the non-metal pattern region are improved.

By forming the passivation contact structures, the recombination of the carriers on the surface of the substrate 100 is reduced, so that the open-circuit voltage of the photovoltaic cell is increased, and thus improving the photoelectric conversion efficiency of the photovoltaic cell.

The first tunneling layer 110 and the second tunneling layer 130 are configured to achieve interface passivation of the surface of the substrate 100, which realizes a chemical passivation effect. Specifically, state density of the interface defects of the surface of the substrate 100 is reduced by saturating suspension bonds of the surface of the substrate 100, thereby reducing recombination centers of the surface of the substrate 100. The presence of the first tunneling layer 110 and the second tunneling layer 130 allows the majority of carriers to be tunneled through the surface of the substrate 100 into the substrate 100, thereby enabling selective transmission of the carrier. Specifically, the majority of carriers to be tunneled through a contact interface between the first tunneling layer 110 and the substrate 100 and a contact interface between the second tunneling layer 130 and the substrate 100 into the substrate 100.

In the embodiments of the present disclosure, the area proportion of the plurality of first pyramid structures 11 with the larger dimensions in the metal pattern region is arranged to be greater than the area proportion of the plurality of third pyramid structures 13 with the larger dimensions in the non-metal pattern region, so that uniformity of dimensions of pyramid structures on the portion of the front surface of the substrate 100 in the metal pattern region is higher and roughness of the pyramid structures on the portion of the front surface of the substrate 100 in the metal pattern region is greater. In this way, on the one hand, the uniformity of the actually deposited first tunneling layer 110 is improved, thereby improving the flatness of the contact interface between the first tunneling layer 110 and the substrate 100. On the other hand, the contact area between the first tunneling layer 110 and the front surface of the substrate 100 is larger such that more carriers are able to be tunneled into the substrate 100 through the contact interface between the first tunneling layer 110 and the substrate 100. In this way, the mobility of the carriers is improved while the low reflectivity of the incident light by the portion of the front surface of the substrate 100 in the non-metal pattern region is maintained, so that the open-circuit voltage and the short-circuit current of the photovoltaic cell are greatly improved, thus improving the photoelectric conversion performance of the photovoltaic cell.

In some embodiments, the plurality of first pyramid structures 11 may be tetrahedron, approximately tetrahedron, pentahedron, approximately pentahedron, or the like. In some embodiments, the plurality of second pyramid structures 12 may be tetrahedron, approximately tetrahedron, pentahedron, approximately pentahedron, or the like.

In some embodiments, an area proportion of the plurality of first pyramid structures 11 on the portion of the front surface of the substrate 100 in the respective metal pattern region is greater than an area proportion of the plurality of second pyramid structures 12 on the portion of the front surface of the substrate 100 in the respective metal pattern region (i.e., a proportion of an area occupied by the plurality of second pyramid structures 12 in the respective metal pattern region). That is, in the embodiments of the present disclosure, dimension arrangement of the plurality of first pyramid structures 11 and the plurality of second pyramid structures 12 in the portion of the front surface of the substrate 100 in the metal pattern region is designed so that the plurality of first pyramid structures 11 with the larger dimensions are predominant on the portion of the front surface of the substrate 100 in the metal pattern region. Since the dimensions of the plurality of first pyramid structures 11 are larger, the number of the first pyramid structures 11 required for the same area is less than that of the second pyramid structures 12 in the case of setting the area proportion of the plurality of second pyramid structures 12 with the smaller dimensions to be greater, thereby making it easier to achieve uniformity of the dimensions. Moreover, since the number of the first pyramid structures 11 is small, the damage of the texture structures (i.e., pyramid structures) to the front surface of the substrate 100 is reduced, thereby reducing the interface state defects on the front surface of the substrate 100 and reducing the generation of the carrier recombination center. That is, not only the uniformity of the dimensions of the texture structures on the portion of the front surface of the substrate 100 in the metal pattern region is larger than that of the texture structures on the portion of the front surface of the substrate 100 in the non-metal pattern region, but also the uniformity of the dimensions of the texture structures in the metal pattern region is further increased, so that the flatness of the contact interface between the first tunneling layer 110 and the substrate 100 is improved, and the contact area between the first tunneling layer 110 and the front surface of the substrate 100 is increased, thereby reducing the interface state defects of the substrate 100, and improving the mobility of carriers.

In some embodiments, the area proportion of the plurality of first pyramid structures 11 on the portion of the front surface of the substrate 100 in the respective metal pattern region is in a range of 80% to 90%, such as 80%~82%, 82%~83%, 83%~85%, 85%~87%, 87%~89%, 89%~90%, or the like. The area proportion of the plurality of second pyramid structures 12 on the portion of the front surface of the substrate 100 in the respective metal pattern region is in a range of 10% to 20%, such as 10%~12%, 12%~14%, 14%~15%, 15%~17%, 17%~19%, 19%~20%, or the like. That is, the area proportion of the plurality of first pyramid structures 11 on the portion of the front surface of the substrate 100 in the metal pattern region is close to 1, so that high uniformity of the dimensions of the texture structures on the portion of the front surface of the substrate 100 in the metal pattern region is realized, and high uniformity of the thicknesses of the first tunneling layer 110 and the first doped conductive layer 120 is realized in the actual operations of depositing the first tunneling layer 110 and the first doped conductive layer 120, so that interface defects at the interface between the first tunneling layer 110 and the substrate 100 are reduced, and the generation of the carrier recombination center at the interface is reduced. In addition, within this range, the roughness of the portion of the front surface of the substrate 100 in the metal pattern region is greatly improved, and further, the contact area between the first tunneling layer 110 and the front surface of the substrate 100 is greatly increased, so that the mobility of carriers is improved while the utilization of the incident light in the non-metal pattern region is improved, thereby improving the photoelectric conversion performance of the photovoltaic cell.

Figure 2:
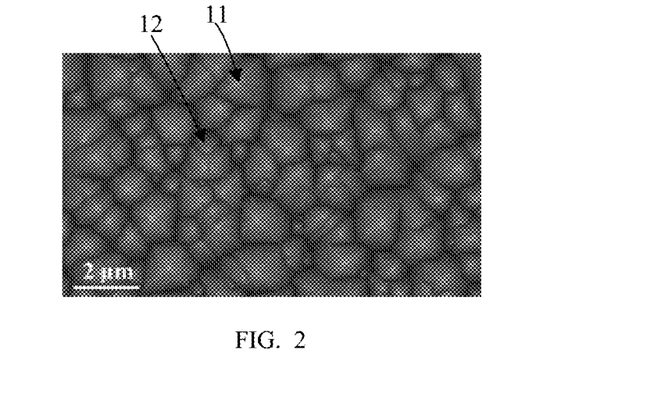
FIG. 2 is a scanning electron microscopy (SEM) structure graph from a top view of a portion of a front surface of a substrate in a metal pattern region in a photovoltaic cell according to an embodiment of the present disclosure.
Figure 3:
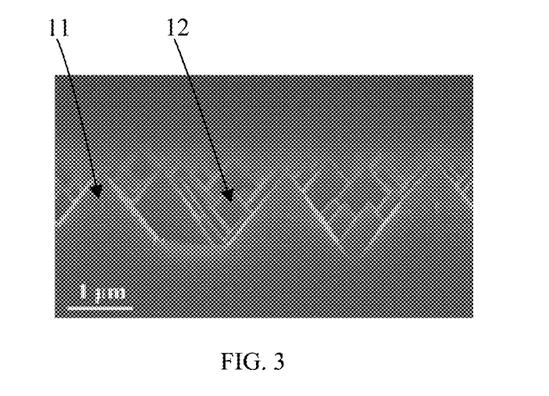
FIG. 3 is a SEM structure graph from a side view of a portion of a front surface of a substrate in a metal pattern region in a photovoltaic cell according to an embodiment of the present disclosure.

Referring to FIGS. 2 to 3, it should be noted that the number of the first pyramid structures 11 and the number of the second pyramid structures 12 on the portion of the front surface of the substrate 100 in the metal pattern region are plural. There may be slight dimensional differences between different first pyramid structures 11 and between different second pyramid structures 12, but an overall dimension of each first pyramid structure 11 is approximately close, and an overall dimension of each second pyramid structure 12 is approximately close. In the embodiment of the present disclosure, the dimensions of the plurality of first pyramid structures 11, the plurality of second pyramid structures 12, the plurality of third pyramid structures 13, and the plurality of fourth pyramid structures 14 are average dimensions within a sampling region. Specifically, in some embodiments, a one-dimensional dimension of a bottom portion of the first pyramid structure 11 may be in a range of 0.7 μm to 3 μm, such as 0.7 μm~0.9 μm, 0.9 μm~1 μm, 1 μm~1.2 μm, 1.2 μm~1.4 μm, 1.4 μm~1.5 μm, 1.5 μm~1.7 μm, 0.9 μm, 120, 2 μm~2.3 μm, 2.3 μm~2.5 μm, 2.5 μm~2.8 μm, or 2.8μ~3 μm. A one-dimensional dimension of a bottom portion of the second pyramid structure 12 may be less than 1 μm, such as 0.1 μm, 0.2 μm, 0.3 μm, 0.4 μm, 0.5 μm, 0.6 μm, 0.7 μm, 0.8 μm, 0.9 μm, 1 μm, or the like. Within this range, not only the roughness of the portion of the front surface of the substrate 100 in the metal pattern region is increased, but also the number of the first pyramid structures 11 is reduced while keeping the area proportion of the plurality of first pyramid structures 11 unchanged, thereby reducing dimensional unevenness caused by the slight dimensional differences between the different first pyramid structures 11. In addition, the dimensions of the second pyramid structures 12 are small, so that the roughness of the portion of the front surface of the substrate 100 in the metal pattern region where the second pyramid structures 12 are disposed is small, so that roughness of a surface of the first doped conductive layer 120 deposited on this portion of the front surface of the substrate 100 is small, thereby making the surface of the first doped conductive layer 120 deposited on this portion have a strong reflection effect on the incident light, which is conducive to reducing the parasitic absorption of the incident light by the first doped conductive layer 120. That is, dimension arrangement of the first pyramid structure 11 with the larger dimensions and the second pyramid structures 12 with the smaller dimensions on the portion of the front surface of the substrate 100 in the metal pattern region is designed, so that the parasitic absorption of the incident light by the first doped conductive layer 120 is reduced while improving the mobility of carriers.

It should be understood that the fact that the one-dimensional dimension of the bottom portion of the first pyramid structure 11 is larger than the one-dimensional dimension of the bottom portion of the second pyramid structure 12 herein means that the one-dimensional dimension of the bottom portion of the first pyramid structure 11 is larger than the one-dimensional dimension of the bottom portion of the second pyramid structure 12 in the same direction, and the fact that the one-dimensional dimension of the bottom portion of the third pyramid structure 13 is larger than the one-dimensional dimension of the bottom portion of the fourth pyramid structure 14 means that the one-dimensional dimension of the bottom portion of the third pyramid structure 13 is larger than the one-dimensional dimension of the bottom portion of the fourth pyramid structure 14 in the same direction.

In some embodiments, a height from top to bottom of each first pyramid structure 11 is not less than a height from top to bottom of each second pyramid structure 12. Specifically, in some embodiments, the height from top to bottom of each first pyramid structure 11 is greater than the height from top to bottom of each second pyramid structure 12, so that a concave-convex degree of the front surface of the substrate 100 where the first pyramid structures 11 are disposed is greater than a concave-convex degree of the front surface of the substrate 100 where the second pyramid structures 12 are disposed, so that a specific surface area of the front surface of the substrate 100 where the first pyramid structures 11 are disposed is large, thereby further increasing the contact area between the first tunneling layer 110 and the front surface of the substrate 100, and improving the mobility of carriers. Meanwhile, the front surface of the substrate 100 where the second pyramid structures 12 are disposed is designed to have a small concave-convex degree, so that the surface of the first doped conductive layer 120 facing the second pyramid structures 12 has a higher reflectivity to the incident light, thereby reducing the parasitic absorption of the incident light by the first doped conductive layer 120.

Specifically, in some embodiments, the height from top to bottom of the first pyramid structure 11 may be 0.5 μm~3.2 μm, 0.5 μm~0.7 μm, 0.7 μm~0.8 μm, 0.8 μm~1 μm, 1 μm~1.2 μm, 1.5 μm~1.7 μm, 1.7 μm~1.9 μm, 1.9 μm~2 μm, 2 μm~2.2 μm, 2.2 μm~2.4 μm, 2.4 μm~2.6 μm, 2.6 μm~2.9 μm, 2.9 μm~3.2 μm, or the like. The height from top to bottom of the second pyramid structure 12 may not be greater than 1.2 μm, such as 0.1 μm, 0.2 μm, 0.3 μm, 0.4 μm, 0.5 μm, 0.6 μm, 0.7 μm, 0.8 μm, 0.9 μm, 1 μm, 1.1 μm, 1.2 μm, or the like.

The first doped conductive layer 120 and the second doped conductive layer 140 are configured for field passivation, which makes minority carriers escape from the interface and reduces a concentration of the minority carriers, so that a carrier recombination rate at the interface of the substrate 100 is low, and the open-circuit voltage, the short-circuit current and the filling factor of the photovoltaic cell are large, thereby improving the photoelectric conversion performance of the photovoltaic cell.

It should be understood that, during actual formation of the first tunneling layer 110 and the first doped conductive layer 120, the smaller the thicknesses of the first tunneling layer 110 and the first doped conductive layer 120, the more similar the topographies of a top surface of the first tunneling layer 110 and a top surface of the first doped conductive layer 120 are to the topographies of the first pyramid structures 11 and the second pyramid structures 12 on the front surface of the substrate 100. Conversely, as the thicknesses of the first tunneling layer 110 and the first doped conductive layer 120 increase, the difference between the topographies of the top surface of the first tunneling layer 110 and the first doped conductive layer 120 and the topographies of the first pyramid structures 11 and the second pyramid structures 12 on the front surface of the substrate 100 increases, and the roughness of the top surface of the first tunneling layer 110 and the top surface of the first doped conductive layer 120 decreases. Based on this, in some embodiments, the thickness of the first tunneling layer 110 may be in a range of 0.5 nm to 5 nm, such as 0.5 nm~1 nm, 1 nm~1.5 nm, 1.5 nm~2 nm, 2 nm~2.5 nm, 2.5 nm~3 nm, 3 nm~3.5 nm, 3.5 nm~4 nm, 4 nm~4.5 nm, 4.5 nm~5 nm, or the like. The thickness of the first doped conductive layer 120 may be in a range of 20 nm to 300 nm, such as 20 nm~30 nm, 50 nm~100 nm, 100 nm~150 nm, 150 nm~200 nm, 200 nm~250 nm, 250 nm~300 nm, or the like. Within this range, the thicknesses of the first tunneling layer 110 and the first doped conductive layer 120 are large, so that the roughness of the top surface of the first doped conductive layer 120 is small, and thus the degree of reflection of the first doped conductive layer 120 on the incident light is large. In this way, on the one hand, the parasitic absorption of the incident light by the first doped conductive layer 120 is reduced, and on the other hand, the incident light reflected by the top surface of the first doped conductive layer 120 is able to be diffracted to the portion of the front surface of the substrate 100 in the non-metal pattern region via the surrounding environment, and then absorbed and utilized again, thereby improving secondary utilization of the incident light. Moreover, within this range, the thicknesses of the first tunneling layer 110 and the first doped conductive layer 120 are not excessively large, so that a problem of mechanical damage to the front surface of the substrate 100 caused by excessive stress due to the excessive thicknesses of the first tunneling layer 110 and the first doped conductive layer 120 is prevented, thereby reducing the interface state defects of the front surface of the substrate 100.

In addition, providing the thickness of the first tunneling layer 110 within this range makes the thickness of the first tunneling layer 110 match with the dimensions of the first pyramid structures 11 and the second pyramid structures 12, so that the contact interface between the first tunneling layer 110 and the front surface of the substrate 100 is relatively flat when the first tunneling layer 110 reaches this thickness range in the actual operation of depositing the first tunneling layer 110, thereby reducing the interface defects of the substrate 100, and improving the mobility of carriers.

It should be understood that, in an actual operation of doping the first doped conductive layer 120, the doping elements are diffused into the first doped conductive layer 120 through a diffusion process. The larger the thickness of the first doped conductive layer 120, the longer the diffusion path of the doping elements, and the smaller the thickness of the first doped conductive layer 120, the shorter the diffusion path of the doping elements. When the diffusion path of the doping elements is excessively short, the doping elements may be accumulated at the interface of the substrate 100, and the doping elements accumulated at the interface of the substrate 100 may not be easily activated during an annealing process, so that a 'dead layer' is generated. The presence of the 'dead layer' affects the number and rate of carriers transmitting from the substrate 100 to the first doped conductive layer 120, thereby affecting the photoelectric conversion performance of the photovoltaic cell.

From the above, it is seen that an activation rate of the first doping elements in the first doped conductive layer 120 is related to the thickness of the first doped conductive layer 120. Based on this, in some embodiments, when the thickness of the first doped conductive layer 120 is in a range of 20 nm to 300 nm, the first doped conductive layer 120 is provided to include the first doping elements, the first doping elements have been annealed and activated to obtain activated first doping elements, and the activation rate of the first doping elements in the first doped conductive layer 120 is in a range of 40% to 80%, such as 40%~50%, 50%~55%, 55%~65%, 65%~70%, 70%~80%, or the like. Within this range, the activation rate of the first doping elements is matched with the thickness of the first doped conductive layer 120 to prevent excessive first doping elements from accumulating at the interface of the substrate 100 and forming the 'dead layer'.

In some embodiments, a concentration of the activated first doping elements is in a range of $1 \times 10^{20}$ atom/cm$^3$ to $6 \times 10^{20}$ atom/cm$^3$, such as $1 \times 10^{20}$ atom/cm$^3$~$2 \times 10^{20}$ atom/cm$^3$, $2 \times 10^{20}$ atom/cm$^3$~$3 \times 10^{20}$ atom/cm$^3$, $3 \times 10^{20}$ atom/cm$^3$~$4 \times 10^{20}$ atom/cm$^3$, $4 \times 10^{20}$ atom/cm$^3$~$5 \times 10^{20}$ atom/cm$^3$, $5 \times 10^{20}$ atom/cm$^3$~$6 \times 10^{20}$ atom/cm$^3$, or the like. Within this range, on the one hand, the concentration of the first doping elements is not excessively large, so that the concentration of the first doping elements totally implanted into the first doped conductive layer 120 in actual operations is not excessively large, and thus the first doping elements are prevented from excessively accumulating at the interface of the substrate 100. On the other hand, within this range, the concentration of the first doping elements is also not excessively small, which helps to maintain a low square resistance of the first doping conductive layer 120, improve ohmic contact between the first doping conductive layer 120 and a metal electrode, and reduce recombination loss of the metal contact, thereby improving the ability of the metal electrode to collect the carriers.

The area proportion of the third pyramid structures 13 with the larger dimensions in the non-metal pattern region is smaller as compared with the area proportion of the first pyramid structures 11 with the larger dimensions in the metal pattern region, so that the number of the third pyramid structures 13 and the fourth pyramid structures 14 per unit area is larger. When the incident light is irradiated between adjacent third pyramid structures 13, between adjacent third pyramid structure 13 and fourth pyramid structure 14, or between adjacent fourth pyramid structures 14, the incident light is repeatedly reflected by side surfaces of the third pyramid structures 13 or side surfaces of the fourth pyramid structures 14, and finally irradiated into the substrate 100, i.e., the diffuse reflection effect on the incident light is enhanced, thereby reducing the reflectivity of the incident light. Moreover, the first doped conductive layer 120 is not provided on the portion of the surface of the substrate 100 in the non-metal pattern region, so that absorption of the incident light in the non-metal pattern region is greatly increased. In this way, the utilization of the incident light by the substrate 100 is improved while increasing the mobility of carriers.

In some embodiments, the third pyramid structures 13 may be tetrahedron, approximately tetrahedron, pentahedron, or approximately pentahedron. In some embodiments, the fourth pyramid structures 14 may be tetrahedron, approximately tetrahedron, pentahedron, or approximately pentahedron.

In some embodiments, the area proportion of the third pyramid structures 13 on the portion of the front surface of the substrate 100 in the respective non-metal pattern region is greater than the area proportion of the fourth pyramid structures 14 on the portion of the front surface of the substrate 100 in the respective non-metal pattern region. That is, dimension arrangement of the third pyramid structures 13 and the fourth pyramid structures 14 on the portion of the front surface of the substrate 100 in the non-metal pattern region is designed in the embodiments of the present disclosure, so that the third pyramid structures 13 with the larger dimensions are predominant on the portion of the front surface of the substrate 100 in the non-metal pattern region. In this way, compared with that the fourth pyramid structures 14 with the smaller dimensions are predominant on the portion of the front surface of the substrate 100 in the non-metal pattern region, the number of the third pyramid structures 13 and the fourth pyramid structures 14 per unit area on the portion of the front surface of the substrate 100 in the non-metal pattern region is smaller, so that damage to the front surface of the substrate 100 caused by the third pyramid structure 13 and the fourth pyramid structure 14 is reduced, thereby reducing the interface state defects of the portion of the front surface of the substrate 100 in the non-metal pattern region. It is seen that since the first tunneling layer 110 and the first doped conductive layer 120 are not provided in the non-metal pattern region, the passivation effect on the portion of the front surface of the substrate 100 in the non-metal pattern region is weak. Therefore, the interface state defects of the portion of the front surface of the substrate 100 in the non-metal pattern region is reduced, thereby reducing the carrier recombination of the portion of the front surface of the substrate 100 in the non-metal pattern region, which plays an important role in ensuring the passivation performance of the portion of the front surface of the substrate 100 in the non-metal pattern region. Therefore, it is ensured that the carrier recombination of the portion of the front surface of the substrate 100 in the non-metal pattern region is not serious while reducing the reflection of the incident light, thereby facilitating the overall photoelectric conversion performance of the photovoltaic cell.

In some embodiments, the area proportion of the third pyramid structures 13 on the portion of the front surface of the substrate 100 in the respective non-metal pattern region is in a range of 50% to 70%, such as 50%~55%, 55%~60%, 60%~65%, 65%~70%, or the like. The area proportion of the fourth pyramid structures on the portion of the front surface of the substrate 100 in the respective non-metal pattern region is in a range of 30% to 50%, such as 30%~35%, 35%~40%, 40%~45%, 45%~50%, or the like. Within this range, the area proportion of the third pyramid structures 13 is larger than that of the fourth pyramid structures 14, so that the number of the third pyramid structures 13 and the fourth pyramid structures 14 per unit area is prevented from causing large damage to the portion of the front surface of the substrate 100 in the non-metal pattern region and causing excessive defects of the portion of the front surface of the substrate 100 in the non-metal pattern region, and less carrier recombination on the portion of the front surface of the substrate 100 in the non-metal pattern region is maintained. In addition, within this range, the area proportion of the third pyramid structures 13 is not excessively large as compared with that of the fourth pyramid structures 14, so that the number of the third pyramid structures 13 and the fourth pyramid structures 14 per unit area on the portion of the front surface of the substrate 100 in the non-metal pattern region is larger, which is conducive to enhancing the diffuse reflection effect on the incident light, thereby reducing the reflectivity of the incident light in the non-metal region.

Figure 4:
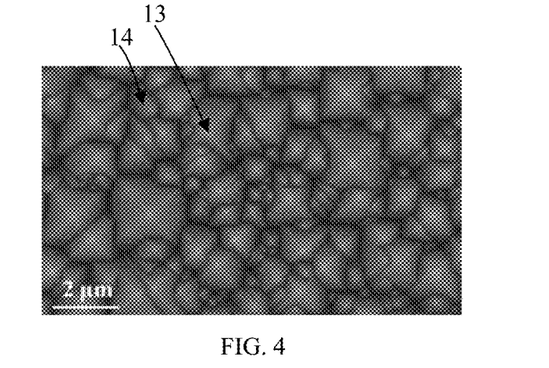
FIG. 4 is a SEM structure graph from a top view of a portion of a front surface of a substrate in a non-metal pattern region in a photovoltaic cell according to an embodiment of the present disclosure.
Figure 5:
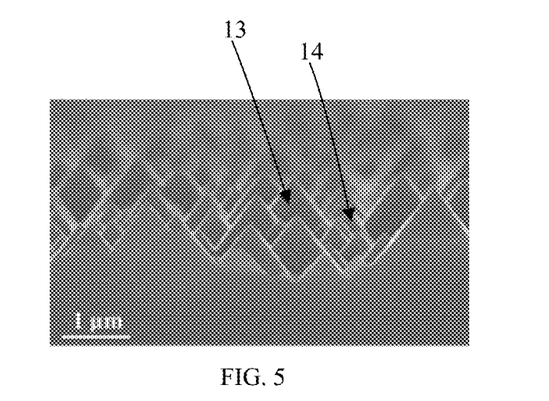
FIG. 5 is a SEM structure graph from a side view of a portion of a front surface of a substrate in a non-metal pattern region in a photovoltaic cell according to an embodiment of the present disclosure.

Referring to FIGS. 4 and 5, it should be noted that the number of the third pyramid structures 13 and the number of the fourth pyramid structures 14 on the portion of the front surface of the substrate 100 in the non-metal pattern region are plural. There may be slight dimensional differences between different third pyramid structures 13 and between different fourth pyramid structures 14, but an overall dimension of each third pyramid structure 13 is approximately close, and an overall dimension of each fourth pyramid structure 14 is approximately close. Specifically, in some embodiments, a one-dimensional dimension of a bottom portion of the third pyramid structure 13 is in a range of 0.7 µm to 3 µm, such as 0.7 µm~0.9 µm, 0.9 µm~1 µm, 1 µm~1.2 µm, 1.2 µm~1.4 µm, 1.4 µm~1.5 µm, 1.5 µm~1.7 µm, 1.7 µm~1.9 µm, 1.9 µm~2 µm, 2 µm~2.3 µm, 2.3 µm~2.5 µm, 2.5 µm~2.8 µm, 2.8 µm~3 µm, or the like. A one-dimensional dimension of a bottom portion of the fourth pyramid structure 14 is less than 1 µm, such as 0.1 µm, 0.2 µm, 0.3 µm, 0.4 µm, 0.5 µm, 0.6 µm, 0.7 µm, 0.8 µm, 0.9 µm, 1 µm, or the like.

It is seen that the dimensions of the first pyramid structures 11 are similar to the dimensions of the third pyramid structures 13, and the dimensions of the second pyramid structures 12 are similar to the dimensions of the fourth pyramid structures 14. That is, in the embodiments of the present disclosure, dimension arrangement of the first pyramid structures 11 and the second pyramid structures 12 in the metal pattern region as well as the third pyramid structures 13 and the fourth pyramid structures 14 in the non-metal pattern region is designed, so that the area proportion of the dimensions of the first pyramid structures 11 with the larger dimensions in the metal pattern region is relatively large, and the area proportion of the third pyramid structures 13 with the larger dimensions in the non-metal pattern region is relatively small, thereby improving the mobility of carriers in the double-sided TOPCON cell while improving the utilization of the incident light.

A specific dimension relationship between the first pyramid structures 11 and the third pyramid structures 13 and a specific dimension relationship between the second pyramid structures 12 and the fourth pyramid structures 14 are not limited in the embodiments of the present disclosure. The one-dimensional dimension of the bottom portion of the first pyramid structure 11 and the one-dimensional dimension of the bottom portion of the third pyramid structure 13 are within the range of 0.7 µm to 3 µm, and the one-dimensional dimension of the bottom portion of the second pyramid structure 12 and the one-dimensional dimension of the bottom portion of the fourth pyramid structure 14 are less than 1 µm, so that the damage of the first pyramid structures 11, the second pyramid structures 12, the third pyramid structures 13, and the fourth pyramid structures 14 to the front surface of the substrate 100 is reduced, and the defect state density of the entire front surface of the substrate 100 is reduced, which is conducive to keeping a low carrier recombination rate at the interface of the substrate 100.

In some embodiments, the height from top to bottom of the third pyramid structure 13 may be in a range of 0.5 µm to 3.2 µm, such as 0.5 µm~0.7 µm, 0.7 µm~0.8 µm, 0.8 µm~1 µm, 1 µm~1.2 µm, 1.5 µm~1.7 µm, 1.7 µm~1.9 µm, 1.9 µm~2 µm, 2 µm~2.2 µm, 2.2 µm~2.4 µm, 2.4 µm~2.6 µm, 2.6 µm~2.9 µm, 2.9 µm~3.2 µm, or the like. The height from top to bottom of the fourth pyramid structure 14 may not be greater than 1.2 µm, such as 0.1 µm, 0.2 µm, 0.3 µm, 0.4 µm, 0.5 µm, 0.6 µm, 0.7 µm, 0.8 µm, 0.9 µm, 1 µm, 1.1 µm, 1.2 µm, or the like.

In some embodiments, the reflectivity of the portion of the front surface of the substrate 100 in the respective non-metal pattern region is in a range of 0.8% to 2%, such as 0.8%~0.9%, 0.9%~1%, 1%~1.2%, 1.2%~1.4%, 1.4%~1.6%, 1.6%~1.8%, 1.8%~2%, or the like. Within this range, the reflectivity of the portion of the front surface of the substrate 100 in the non-metal pattern region is low, which is conducive to enhancing the utilization of the incident light by the portion of the front surface of the substrate 100 in the non-metal pattern region, thereby increasing the number of carriers, the short-circuit current and the open-circuit voltage, and improving the photoelectric conversion performance of the photovoltaic cell.

In some embodiments, the photovoltaic cell further includes a first passivation layer 150, a first portion of the first passivation layer 150 is disposed on a surface of the first doped conductive layer 120 away from the substrate 100, and a second portion of the first passivation layer 150 is disposed on the portion of the front surface of the substrate 100 in the respective non-metal pattern region. The first passivation layer 150 has a good passivation effect on the front surface of the substrate 100. For example, the first passivation layer 150 may chemically passivate the suspension bonds on the front surface of the substrate 100, reduce the defect state density of the front surface of the substrate 100, and suppress the carrier recombination on the front surface of the substrate 100. The first portion of the first passivation layer 150 is directly in contact with the front surface of the substrate 100 such that there is no first tunneling layer 110 and first doped conductive layer 120 between the first portion of the first passivation layer 150 and the substrate 100, thereby reducing the parasitic absorption of the incident light by the first doped conductive layer 120.

In some embodiments, the first portion of the first passivation layer 150 is not flush with the second portion of the first passivation layer 150. Specifically, a top surface of the first portion of the first passivation layer 150 may be lower than a top surface of the second portion of the first passivation layer 150, so that a thickness of the first portion disposed on the front surface of the substrate 100 is not excessively thick, thereby preventing the front surface of the substrate 100 from generating more carrier recombination centers due to too many interface state defects on the front surface of the substrate 100 which are generated from the stress damage caused by the large thickness of the first portion to the front surface of the substrate 100. In addition, the area proportion of the third pyramid structures 13 with the larger dimensions on the portion of the front surface of the substrate 100 in the non-metal pattern region is smaller than that of the first pyramid structures 11 with the larger dimensions on the portion of the front surface of the substrate 100 in the metal pattern region the metal pattern region, so that the concave-convex degree of the portion of the front surface of the substrate 100 in the non-metal pattern region is not excessively large. Thus, in the actual operation of depositing the first passivation layer 150, the concave-convex degree of the surface of the first passivation layer 150 is not excessively large, which improves the flatness of the first passivation layer 150, thereby improving the passivation performance of the first passivation layer 150.

In some embodiments, the first passivation layer 150 may be a single-layer structure. In some embodiments, the first passivation layer 150 may also be a multi-layer structure. In some embodiments, the material of the first passivation layer 150 may be at least one of silicon oxide, aluminum oxide, silicon nitride, or silicon oxynitride.

In some embodiments, a plurality of platform protrusion structures 15 are provided on the rear surface of the substrate 100. A one-dimensional dimension of a bottom portion of each platform protrusion structure 15 is greater than the one-dimensional dimension of the bottom portion of the first pyramid structure 11 and greater than the one-dimensional dimension of the bottom portion of the third pyramid structure 13, and a height from top to bottom of the platform protrusion structure 15 is smaller than the height of the first pyramid structure 11 and smaller than the height of the third pyramid structure 13. Specifically, the platform protrusion structure 15 includes a base portion of a pyramid structure (i.e., a bottom portion of the pyramid structure that does not contain a spire).

That is, the concave-convex degree of the pyramid structures disposed on the front surface of the substrate 100 is greater than the concave-convex degree of the platform convex structures disposed on the rear surface of the substrate 100, so that the roughness of the front surface of the substrate 100 is greater than the roughness of the rear surface of the substrate 100. In this way, in some embodiments, since the front surface of the substrate 100 receives more incident light, the front surface of the substrate 100 is provided with pyramid structures having larger specific surface areas in order to enhance the absorption capability of the front surface of the substrate 100 to the incident light, which enhances the diffuse reflection effect on the front surface of the substrate 100 is enhanced, so that the utilization of the incident light by the front surface of the substrate 100 is greater. Since the rear surface of the substrate 100 receives less incident light, the rear surface of the substrate 100 is provided with the platform protrusion structures 15 so that the roughness of the rear surface of the substrate 100 is smaller than the roughness of the front surface of the substrate 100. That is, the rear surface of the substrate 100 is relatively flat as compared with the front surface of the substrate 100, so that the second tunneling layer 130, the second doped conductive layer 140, and the second passivation layer 160 formed on the rear surface of the substrate 100 have flat morphologies, and the second tunneling layer 130, the second doped conductive layer 140, and the second passivation layer 160 are able to be uniformly formed on the rear surface of the substrate 100, which is conducive to improving the passivation effect of the second tunneling layer 130, the second doped conductive layer 140, and the second passivation layer 160 on the rear surface of the substrate 100, thus reducing the defect state density of the rear surface. In this way, the photoelectric conversion performance of the photovoltaic cell is improved as a whole by improving the utilization of the incident light and the passivation effect on the substrate 100.

In some embodiments, the photovoltaic cell further includes a second passivation layer 160 for covering a surface of the second doped conductive layer 140 away from the substrate 100. The second passivation layer 160 has a good passivation effect on the rear surface of the substrate 100, which reduces the defect state density on the rear surface of the substrate 100, and suppresses the carrier recombination on the rear surface of the substrate 100. In some embodiments, the second passivation layer 160 may be a single-layer structure. In some embodiments, the second passivation layer 160 may also be a multi-layer structure. In some embodiments, the material of the second passivation layer 160 may be at least one of silicon oxide, aluminum oxide, silicon nitride, or silicon oxynitride.

In some embodiments, a doping element type of the first doped conductive layer 120 is the same as a doping element type of the substrate 100, and a doping element type of the second doped conductive layer 140 is different from the doping element type of the first doped conductive layer 120. That is, the second doped conductive layer 140 forms a PN junction with the substrate 100, and the first doped conductive layer 120 on the front surface does not form a PN junction with the substrate 100, so that the formation of the PN junction is avoided leading to serious carrier recombination in preset regions of the front surface. In addition, both the second tunneling layer 130 and the second doped conductive layer 140 are disposed on the entire rear surface of the substrate 100, so that an area of the PN junction formed between the second doped conductive layer 140 and the substrate 100 is large, so that the number of the photogenerated carriers is large, and concentrations of the carriers in the second doped conductive layer 140 and in the substrate 100 are increased.

Specifically, in some embodiments, the substrate 100 is an N-type substrate. Based on this, the first doped conductive layer 120 may be provided as an N-type doped conductive layer, and the second doped conductive layer 140 may be provided as a P-type doped conductive layer. The P-type second doped conductive layer 140 forms a PN junction with the N-type substrate 100, thereby forming the rear junction (i.e., the PN junction formed on the rear surface of the substrate 100).

Since the rear junction is formed on the rear surface of the substrate 100, the rear surface of the substrate 100 is provided with a flat morphology such that the second tunneling layer 130 is able to be formed more closely to the rear surface of the substrate 100, so that the photogenerated carriers generated by the PN junction are smoothly transmitted into the substrate 100, thereby further improving the transmission efficiency of the carriers.

In some embodiments, the substrate 100 may also be a P-type semiconductor substrate, the first doped conductive layer 120 is a P-type doped conductive layer, and the second doped conductive layer 140 is an N-type doped conductive layer.

In some embodiments, the material of the first doped conductive layer 120 includes at least one of silicon carbide, amorphous silicon, microcrystalline silicon, or polycrystalline silicon. In some embodiments, the second doped conductive layer 140 includes at least one of silicon carbide, amorphous silicon, microcrystalline silicon, or polycrystalline silicon.

In some embodiments, the photovoltaic cell further includes a first electrode 170 disposed in the respective metal pattern region and electrically connected to the first doped conductive layer 120. The PN junction formed on the rear surface of the substrate 100 is used to receive the incident light and generate photogenerated carriers, and the generated photogenerated carriers are transmitted from the substrate 100 to the first doped conductive layer 120 and then to the first electrode 170 for collecting the photogenerated carriers. Since the doping element type of the first doped conductive layer 120 is the same as the doping element type of the substrate 100, recombination loss of the metal contact between the first electrode 170 and the first doped conductive layer 120 is reduced, so that the carrier contact recombination between the first electrode 170 and the first doped conductive layer 120 is reduced, and the short-circuit current and the photoelectric conversion performance of the photovoltaic cell are improved.

Figure 6:
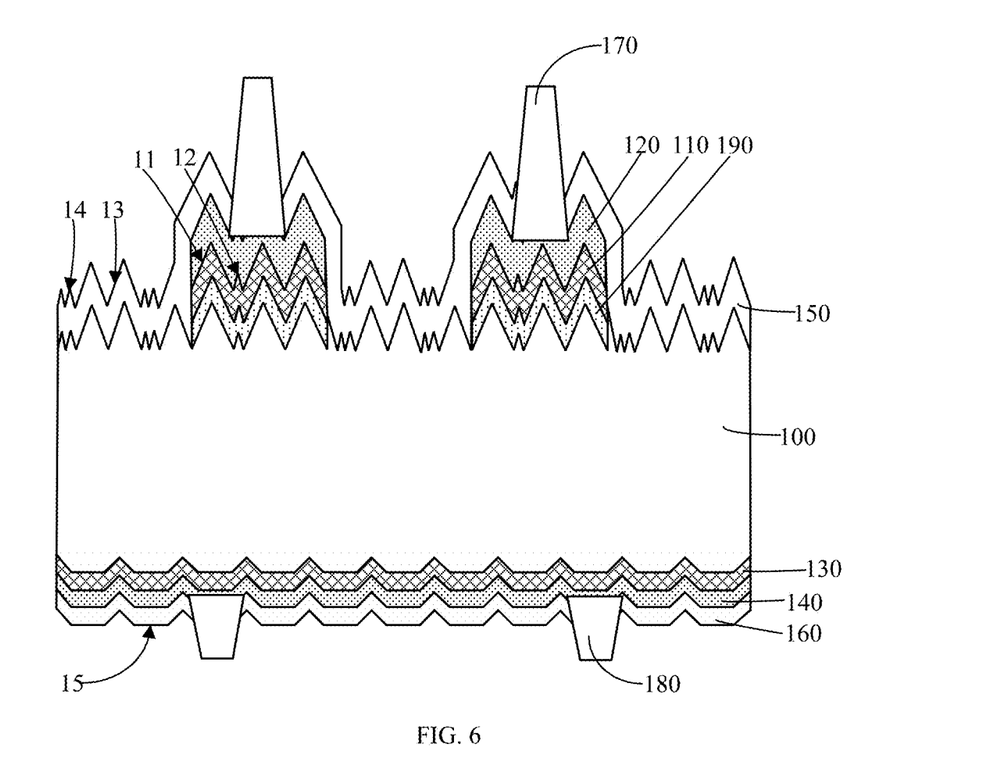
FIG. 6 is another schematic cross-sectional view of a photovoltaic cell according to an embodiment of the present disclosure.

In some embodiments, the photovoltaic cell further includes a diffusion region 190 disposed inside a portion of the substrate 100 in the respective metal pattern region, a top portion of the diffusion region 190 is in contact with the first tunneling layer 110, and a doping element concentration of the diffusion region 190 is greater than a doping element concentration of the substrate 100. The diffusion region 190 may serve as a channel for carrier transmission, and the diffusion region 190 is formed only in the portion of the substrate 100 in the metal pattern region, so that carriers in the substrate 100 are easily transmitted into the doped conductive layer through the diffusion region 190, i.e., the diffusion region 190 functions as a channel for carrier transmission. In addition, since the diffusion region 190 is provided only in the portion of the substrate 100 in the metal pattern region, the carriers in the substrate 100 are able to be concentratedly transmitted to the diffusion region 190 and then to the first doped conductive layer 120 via the diffusion region 190, so that the carrier concentration of the first doped conductive layer 120 is greatly increased. It should be noted that in the embodiments of the present disclosure, the diffusion region 190 is not provided in the portion of the substrate 100 in the non-metal pattern region, so that the carrier concentration of the portion of the front surface of the substrate 100 in the non-metal pattern region is not excessively large, and serious carrier recombination on the portion of the front surface of the substrate 100 in the non-metal pattern region is avoided. Moreover, the carriers in the substrate 100 is also prevented from being transmitted to the portion of the front surface of the substrate 100 in the non-metal pattern region, thereby avoiding excessive carrier recombination due to the 'dead layer' generated on the portion of the front surface of the substrate 100 in the non-metal pattern region caused by accumulation of the carriers on the portion of the front surface of the substrate 100 in the non-metal pattern region, thereby improving the overall photoelectric conversion performance of the photovoltaic cell.

In some embodiments, the photovoltaic cell further includes a second electrode 180 disposed on the rear surface of the substrate 100, the second electrode 180 penetrates through the second passivation layer 160 and electrically contacts the second doped conductive layer 140.

In the photovoltaic cell provided in the above embodiments, the area proportion of the first pyramid structures 11 with larger dimensions in the metal pattern region are set to be greater, so that the uniformity of dimensions of pyramid structures in the metal pattern region is higher as compared with that of pyramid structures in the non-metal pattern region. In this way, in the actual operation of depositing the first tunnel layer 110 and the first doped conductive layer 120, the uniformity of thicknesses of the deposited first tunnel layer 110 and first doped conductive layer 120 is improved, the interface defects at the interface between the first tunnel layer 110 and the front surface of the substrate 100 is reduced, and the mobility of carriers in the substrate 100 to the first doped conductive layer 120 is improved. In addition, the area proportion of the third pyramid structures 13 with the larger dimensions in the non-metal pattern region is relatively small, so that the number of the third pyramid structures 13 and the fourth pyramid structures 14 per unit area in the non-metal pattern region is larger, the reflectivity of the incident light is low. Moreover, the first doped conductive layer 120 is not provided on a portion of the front surface of the substrate 100 in the non-metal pattern region, so that absorption of the incident light in the non-metal pattern region is greatly increased.

Figure 7:
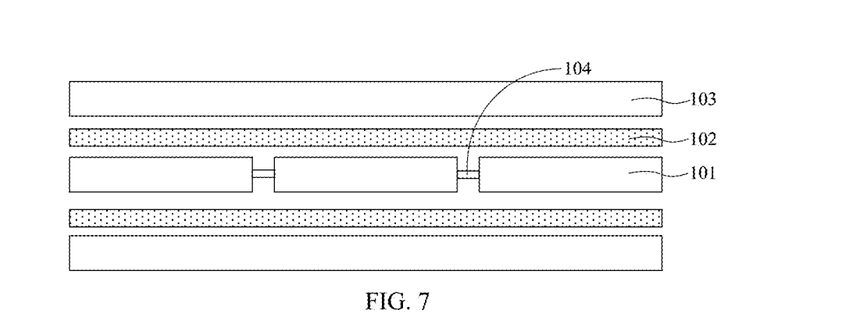
FIG. 7 is a schematic structural diagram of a photovoltaic module according to an embodiment of the present disclosure.

Accordingly, some embodiments of the present disclosure further provide a photovoltaic module. As shown in FIG. 7, the photovoltaic module includes at least one cell string each formed by a plurality of photovoltaic cells 101 provided in the above embodiments which are electrically connected, at least one encapsulation layer 102 each for covering a surface of a respective cell string, and at least one cover plate 103 each for covering a surface of a respective encapsulation layer 102 facing away from the respective cell string. The photovoltaic cells 101 are electrically connected in whole or in pieces to form a plurality of cell strings electrically connected in series and/or in parallel.

Specifically, in some embodiments, the plurality of cell strings may be electrically connected to each other by conductive tapes 104. The encapsulation layer 102 covers the front surface and the rear surface of the photovoltaic cell 101. Specifically, the encapsulation layer 102 may be an organic encapsulation adhesive film such as an ethylene-vinyl acetate copolymer (EVA) adhesive film, a polyethylene octene co-elastomer (POE) adhesive film, a polyethylene terephthalate (PET) adhesive film, or the like. In some embodiments, the cover plate 103 may be a glass cover plate, a plastic cover plate, or the like having a light transmitting function. Specifically, the surface of the cover plate 103 facing towards the encapsulation layer 102 may be a concavo-convex surface, thereby increasing utilization of the incident light. Although the present disclosure is disclosed in the above embodiments, the present disclosure is not intended to limit the claims. Any person skilled in the art may make several possible changes and modifications without departing from the concept of the present disclosure. Therefore, the protection scope of the present disclosure shall be subject to the scope defined in the claims of the present disclosure.

Those of ordinary skill in the art should appreciate that the embodiments described above are specific embodiments of the present disclosure, and in practical application, various changes may be made thereto in form and detail without departing from the spirit and scope of the present disclosure. Any person skilled in the art may make his or her own changes and modifications without departing from the spirit and scope of the present disclosure. Therefore, the protection scope of the present disclosure shall be subject to the scope limited by the claims.

What is claimed is:

1. A photovoltaic cell comprising:
    a substrate, wherein the substrate has a front surface with a plurality of metal pattern regions and a plurality of non-metal pattern regions;
    a plurality of first pyramid structures and a plurality of second pyramid structures disposed in each of the plurality of metal pattern regions, wherein a dimension of a bottom portion of each of the plurality of first pyramid structures is greater than a dimension of a bottom portion of each of the plurality of second pyramid structures;
    a plurality of third pyramid structures and a plurality of fourth pyramid structures disposed in each of the plurality of non-metal pattern regions, wherein a dimension of a bottom portion of each of the plurality of third pyramid structures is greater than a dimension of a bottom portion of each of the plurality of fourth pyramid structures; and wherein an area proportion of the plurality of first pyramid structures on a portion of the front surface of the substrate in a respective metal pattern region is greater than an area proportion of the plurality of third pyramid structures on a portion of the front surface of the substrate in a respective non-metal pattern region;
    a first tunneling layer and a first doped conductive layer stacked on the portion of the front surface of the substrate in the respective metal pattern region in a direction away from the substrate; and
    a second tunneling layer and a second doped conductive layer stacked on a rear surface of the substrate in a direction away from the substrate.

2. The photovoltaic cell according to claim 1, wherein the area proportion of the plurality of first pyramid structures on the portion of the front surface of the substrate in the respective metal pattern region is greater than an area proportion of the plurality of second pyramid structures on the portion of the front surface of the substrate in the respective metal pattern region.

3. The photovoltaic cell according to claim 2, wherein the area proportion of the plurality of first pyramid structures on the portion of the front surface of the substrate in the respective metal pattern region is in a range of 80% to 90%, and the area proportion of the plurality of second pyramid structures on the portion of the front surface of the substrate in the respective metal pattern region is in a range of 10% to 20%.

4. The photovoltaic cell according to claim 2, wherein a one-dimensional dimension of the bottom portion of each of the plurality of first pyramid structures is in a range of 0.7 μm to 3 μm, and a one-dimensional dimension of the bottom portion of each of the plurality of second pyramid structures is less than 1 μm.

5. The photovoltaic cell according to claim 4, wherein a thickness of the first tunneling layer is in a range of 0.5 nm to 5 nm, and a thickness of the first doped conductive layer is in a range of 20 nm to 300 nm.

6. The photovoltaic cell according to claim 4, wherein the first doped conductive layer includes first doping elements, the first doping elements have been annealed and activated to obtain activated first doping elements, and an activation rate of the first doping elements in the first doped conductive layer is in a range of 40% to 80%.

7. The photovoltaic cell according to claim 6, wherein a concentration of the activated first doping elements is in a range of $10^{20}$ atom/cm$^3$ to $6 \times 10^{20}$ atom/cm$^3$.

8. The photovoltaic cell according to claim 1, wherein a height from top to bottom of each of the plurality of first pyramid structures is not less than a height of from top to bottom of each of the plurality of second pyramid structures.

9. The photovoltaic cell according to claim 1, wherein the area proportion of the plurality of third pyramid structures on the portion of the front surface of the substrate in the respective non-metal pattern region is greater than an area proportion of the plurality of fourth pyramid structures on the portion of the front surface of the substrate in the respective non-metal pattern region.

10. The photovoltaic cell according to claim 9, wherein the area proportion of the plurality of third pyramid structures on the portion of the front surface of the substrate in the respective non-metal pattern region is in a range of 50% to 70%, and the area proportion of the plurality of fourth pyramid structures on the portion of the front surface of the substrate in the respective non-metal pattern region is in a range of 30% to 50%.

11. The photovoltaic cell according to claim 9, wherein a one-dimensional dimension of the bottom portion of each of the plurality of third pyramid structures is in a range of 0.7 μm to 3 μm, and a one-dimensional dimension of the bottom portion of each of the plurality of fourth pyramid structures is less than 1 μm.

12. The photovoltaic cell according to claim 11, wherein a reflectivity of the portion of the front surface of the substrate in the respective non-metal pattern region is in a range of 0.8% to 2%.

13. The photovoltaic cell according to claim 12, further comprising:
a first passivation layer, wherein a first portion of the first passivation layer is disposed on a surface of the first doped conductive layer away from the substrate, and a second portion of the first passivation layer is disposed on the portion of the front surface of the substrate in the respective non-metal pattern region.

14. The photovoltaic cell according to claim 13, wherein the first portion of the first passivation layer is not flush with the second portion of the first passivation layer.

15. The photovoltaic cell according to claim 1, further comprising a first electrode disposed in the respective metal pattern region and electrically connected to the first doped conductive layer.

16. The photovoltaic cell according to claim 1, further comprising:
a diffusion region disposed inside a portion of the substrate in the respective metal pattern region, wherein a top portion of the diffusion region is in contact with the first tunneling layer, and a doping element concentration of the diffusion region is greater than a doping element concentration of the substrate.

17. The photovoltaic cell according to claim 1, wherein a doping element type of the first doped conductive layer is the same as a doping element type of the substrate, and a doping element type of the second doped conductive layer is different from the doping element type of the first doped conductive layer.

18. The photovoltaic cell according to claim 17, wherein the substrate includes an N-type substrate.

19. The photovoltaic cell according to claim 1, wherein a material of the first doped conductive layer includes at least one of silicon carbide, amorphous silicon, microcrystalline silicon and polycrystalline silicon, and the second doped conductive layer includes at least one of silicon carbide, amorphous silicon, microcrystalline silicon and polycrystalline silicon.

20. A photovoltaic module comprising:
at least one cell string, each of the least one cell string formed by a plurality of photovoltaic cells which are electrically connected;
at least one encapsulation layer, each of the at least one encapsulation layer configured to cover a surface of a respective cell string; and
at least one cover plate, each of the at least one cover plate configured to cover a surface of a respective encapsulation layer facing away from the respective cell string;
wherein each of the plurality of photovoltaic cells includes:
a substrate, wherein the substrate has a front surface with a plurality of metal pattern regions and a plurality of non-metal pattern regions;
a plurality of first pyramid structures and a plurality of second pyramid structures disposed in each of the plurality of metal pattern regions, wherein a dimension of a bottom portion of each of the plurality of first pyramid structures is greater than a dimension of a bottom portion of each of the plurality of second pyramid structures;
a plurality of third pyramid structures and a plurality of fourth pyramid structures disposed in each of the plurality of non-metal pattern regions, wherein a dimension of a bottom portion of each of the plurality of third pyramid structures is greater than a dimension of a bottom portion of each of the plurality of fourth pyramid structures; and wherein an area proportion of the plurality of first pyramid structures on a portion of the front surface of the substrate in a respective metal pattern region is greater than an area proportion of the plurality of third pyramid structures on a portion of the front surface of the substrate in a respective non-metal pattern region;
a first tunneling layer and a first doped conductive layer stacked on the portion of the front surface of the substrate in the respective metal pattern region in a direction away from the substrate; and
a second tunneling layer and a second doped conductive layer stacked on a rear surface of the substrate in a direction away from the substrate.

* * * * *